United States Patent [19]

Sato et al.

[11] Patent Number: 4,689,649

[45] Date of Patent: Aug. 25, 1987

[54] SEMICONDUCTOR RADIATION DETECTOR

[75] Inventors: Noritada Sato; Toshikazu Suzuki; Yasukazu Seki, all of Yokosuka, Japan

[73] Assignee: Fuji Electric Company Ltd., Japan

[21] Appl. No.: 771,622

[22] Filed: Sep. 3, 1985

[30] Foreign Application Priority Data

Sep. 19, 1984 [JP] Japan ................................ 59-195990

[51] Int. Cl.⁴ ........................ H01L 27/14; G01T 1/24; G01T 1/22
[52] U.S. Cl. .................................... 357/29; 250/370; 357/2
[58] Field of Search ............................... 357/29, 20, 2; 250/370.01, 370.07, 370.09, 370.14, 370 R, 370 FT, 370 G, 370 K

[56] References Cited

U.S. PATENT DOCUMENTS 4,394,676 7/1983 Agouridis .............................. 357/29

Primary Examiner—James W. Davie
Assistant Examiner—Georgia Y. Epps
Attorney, Agent, or Firm—Stevens, Davis, Miller & Mosher

[57] ABSTRACT

A semiconductor device for detecting incident gamma-radiation wherein the output from the device is relatively independent of the energy of the incident radiation. The device includes a semiconductor substrate having a depletion layer formed therein by an applied voltage. The depletion layer is shaped such that it includes a plurality of elongated projections within a plane parallel to the surface of the substrate. The minimum distance between the edge of the substrate and the outer extent of the depletion layer is substantially equal to the average range of mobility of secondary electrons created by the gamma rays having the highest energy of the gamma-rays to be detected. The device further includes means for counting the current pulses generated in the depletion layer by secondary electrons created by the incident gamma rays.

6 Claims, 7 Drawing Figures

SEMICONDUCTOR RADIATION DETECTOR

BACKGROUND OF THE INVENTION

The present invention relates to a semiconductor radiation detector for counting gamma-rays. More particularly, the invention relates to such a detector having an improved gamma-ray energy versus gamma-ray count characteristic for the same dosimetric field.

A Gieger-Muller ("G-M") counter has heretofore been used as a gamma-ray detector. Major disadvantages of the G-M counter are its short life, poor linearity between the gamma count and the dose rate, and the need for a high-voltage supply. With a view to eliminating these defects, semiconductor radiation detectors which take advantage of the characteristics of the semiconductor were developed and have been used commercially. The heart of this semiconductor radiation detector is a wafer of a semiconductor, such as germanium (Ge) or silicon (Si), into which lithium (Li) is diffused to increase the specific resistance of the wafer so that a depletion layer will form upon irradiation with gamma-rays. When gamma-rays penetrate through the depletion layer, secondary electrons are produced as a result of any one of three gamma-ray interactions with the semiconductor, such as the photoelectric effect, the Compton effect or electron-pair production. The resulting secondary ions further interact with the lattice atoms in the wafer to create electron-hole pairs which are converted to current pulses. The dose of gamma-rays can be measured by counting these pulses.

The gamma-ray dosimeter is used principally for counting the number of radioactive gamma-rays. However, for reasons discussed below, the conventional semiconductor radiation detector counts different numbers of pulses for individual gamma-rays in the same dosimetric field if they have different levels of energy. Consequently, the pulse count output of the detector is not the correct indication of the dose of gamma-rays in the dosimetric field of interest.

The operating theory of the semiconductor radiation detector is illustrated in FIG. 3: a p-type silicon substrate 1 is provided with an n-type layer by, for example, the diffusion process, to create a p-n junction. This p-n junction is given a reverse bias voltage $V_B$ that is applied between electrodes 3 and 4 to produce a depletion layer 5 in the substrate. When incident gamma-rays 6 penetrate into the depletion layer 5, secondary electrons 7 are generated as a result of any one of the three gamma-ray interactions with the semiconductor, such as the photoelectric effect A, the Compton effect B or the electron-pair production C. The produced secondary electrons further interact with lattice atoms in the semiconductor to form electron-hole pairs 8, which are converted into current pulses 9 and are counted by a counter 10 incorporating an amplifier. Part of the incident gamma-rays emerge from the depletion layer 5 as scattered gamma-rays 11.

The gamma count C, or the number of pulses for a unit dose rate, is given by:

$$C = K \frac{\mu_{si} \cdot l}{\mu_{air} \cdot E} S \qquad (1)$$

wherein
K: a constant
$\mu_{si}$: the absorption coefficient of the detector (Si)
$\mu_{air}$: the absorption coefficient of air
l: the thickness of the depletion layer penetrated by incident gamma-rays
S: the area of the depletion layer penetrated by incident gamma-rays
E: the energy of the incident gamma-rays.

As is self-evident from formula (1), for given values of l, the thickness of the depletion layer parallel to the plane of the silicon substrate 1, C varies inversely with E, or stated more specifically, a smaller value of C results from gamma-rays of higher energy. There is, therefore, deterioration in the quality of radiation detection because such detector's sensitivity is not independent of the energy of gamma-rays in the same dosimetric field.

The principal purpose of the invention, therefore, is to provide a semiconductor radiation detector that has an improved quality of radiation detection and which produces the same number of current pulses irrespective of the energy of individual gamma-rays within the same dosimetric field.

SUMMARY OF THE INVENTION

In order to achieve these and other objects of the invention, the semiconductor device of the present invention detects incident gamma-radiation. The device comprises a semiconductor substrate which includes means for producing a depletion layer in the substrate. The depletion layer is produced by applying a voltage to separate surfaces of the substrate. The depletion layer is shaped such that it includes a plurality of elongated projections within a plane parallel to the surface of the substrate. The minimum distance between the edge of the substrate and the outer extent of the depletion layer is substantially equal to the average range of mobility of secondary electrons created by the gamma-rays having the highest energy of the gamma rays to be detected. The device further includes means for counting current pulses due to the electron-hole pairs generated in the depletion layer by secondary electrons created by interactions between gamma-rays incident on the substrate. Preferably, the device has a substrate that consists essentially of silicon and the depletion layer is formed adjacent a p-n junction in a silicon substrate. It is further preferred that the elongated projections of the depletion layer emanate radially from a central portion of the substrate.

BRIEF DESCRIPTION OF THE DRAWINGS

FIGS. 4A and 4B illustrate the effects of gamma-rays incident on the area surrounding the depletion layer formed in the semiconductor radiation detector, wherein FIG. 4a is a cross section and FIG. 4B is a plan view.

DESCRIPTION OF THE PREFERRED EMBODIMENTS

Figure 1:
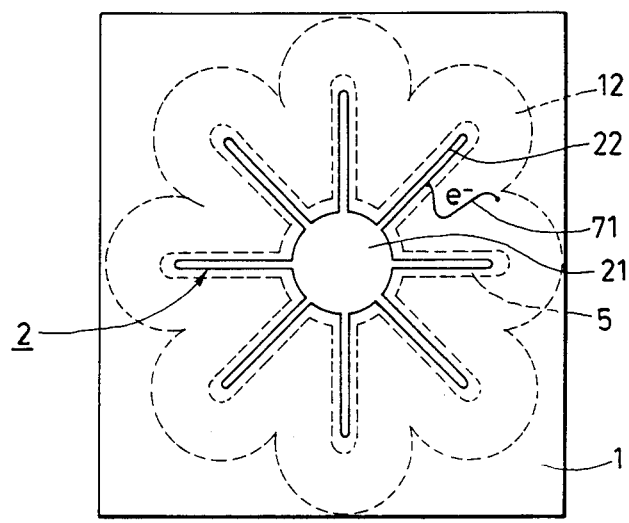
FIG. 1 is a plan view of a semiconductor substrate in a radiation detector constructed in accordance with one embodiment of the present invention.

An embodiment of the detector in accordance with the present invention is shown in FIG. 1. The device includes a p-type silicon substrate 1 in a square shape measuring 43 mm on each one of the four sides. An n-type region 2 is formed in the substrate 1 and has a shape that consists of a central region 21 with a diameter of 1 mm, and a plurality of radially spaced projections 22, each having a rectangular shape 0.2 mm wide and 16 mm long. When a reverse bias of, for example, 20 volts is applied to the p-n junction between the type substrate 1 and the n-type region 2 a depletion layer 5 is formed. Secondary electrons 71 are formed in the region adjacent the depletion layer as a result of interactions with incident gamma-rays having a maximum energy of 6 MeV, even in the narrowest portion of that region. Due to the position of the depletion layer 5 around the n-type region 2, the probability that such secondary electrons will enter the region 5 is high enough to make a significant contribution to the production of electron-hole pairs. As a result, the energy dependency of the sensitivity of the radiation detector is reduced.

Figure 3:
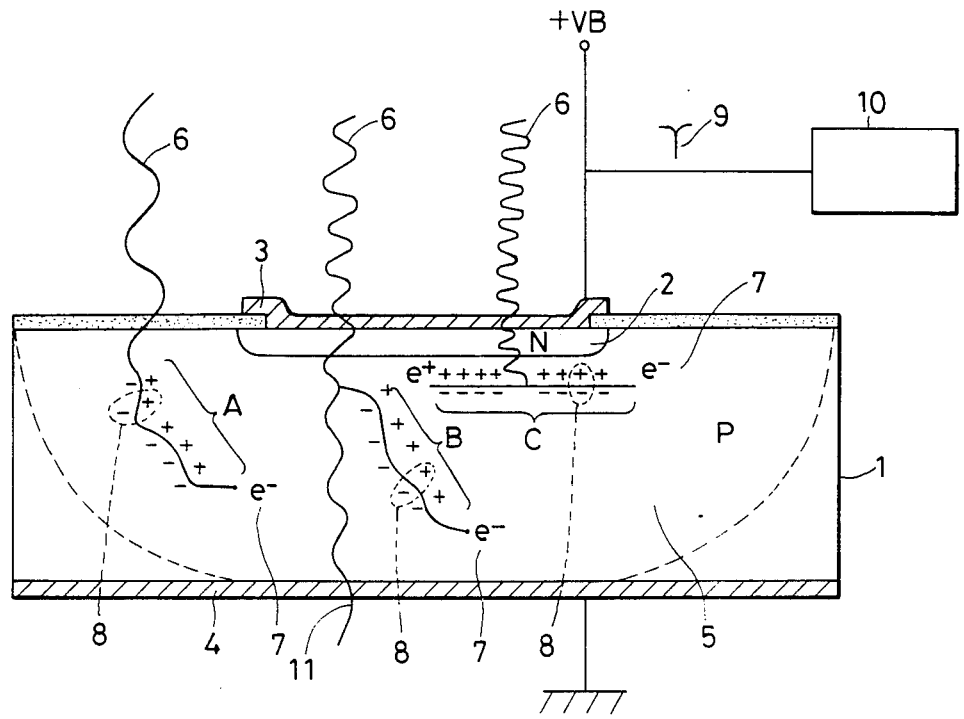
FIG. 3 is a schematic cross section showing the operating theory of the semiconductor radiation detector.
Figure 4A:
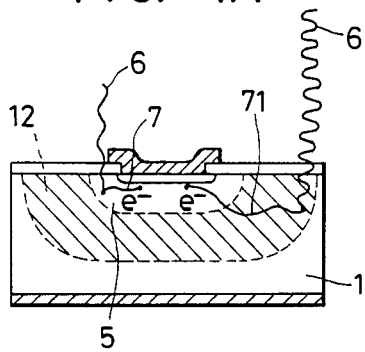
Figure 4B:
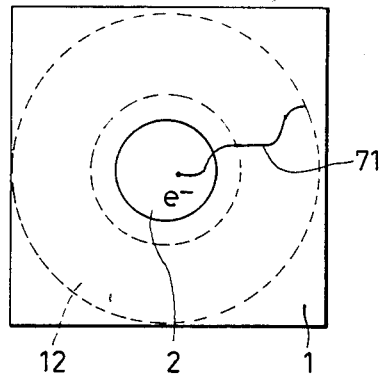
Figure 5:
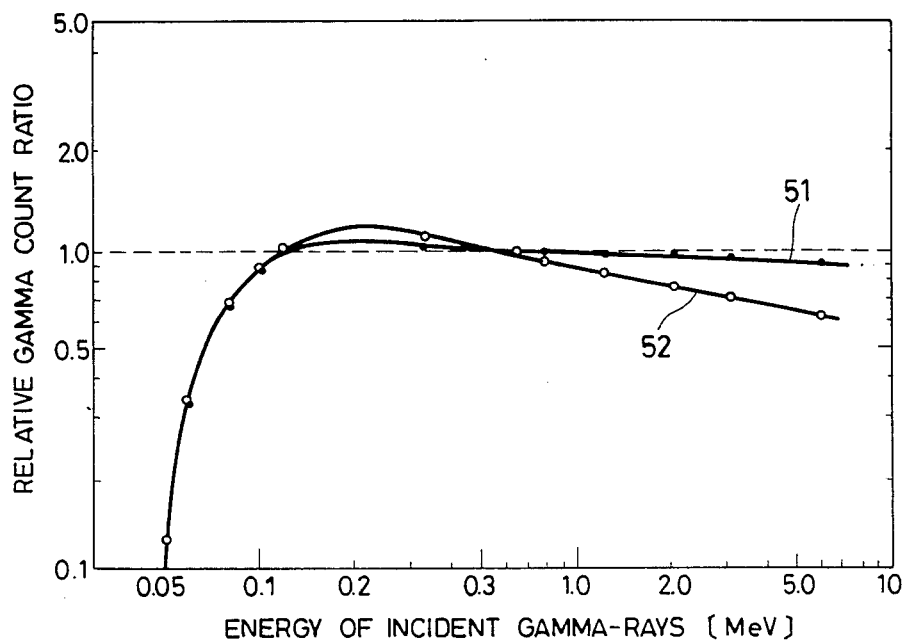
FIG. 5 is a graph comparing the quality of radiation detection as between the semiconductor radiation detector of the present invention and the conventional device.

The relative gamma count ratio versus energy of incident gamma-rays for two samples is a value calibrated against a standard dose rate field. In FIG. 5 curve 51 shows the characteristics of a detector prepared in accordance with the present invention whereas curve 52 illustrates the characteristics of a detector consisting of a p-type silicon substrate (43 mm×43 mm) and a circular n-type region (1 mm) formed in the center of the substrate as shown in FIGS. 4A and 4B. The detector constructed in accordance with the present invention has a significantly improved quality of radiation detection as indicated by the generally horizontal portion of the curve in the energy range of 0.2 to 5.0 MeV. In the lower energy range, the relative gamma count ratio drops for both curves 51 and 52 because the counter 10 (see FIG. 3) has a threshold level of 0.06 MeV so that it does not count the number of pulses below that level.

Figure 2:
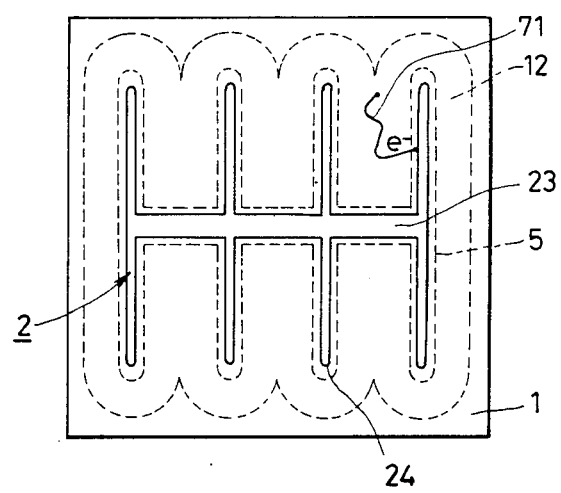
FIG. 2 is a plan view of a semiconductor substrate in a detector constructed in accordance with another embodiment of the invention.

FIG. 2 shows another embodiment of the radiation detector constructed in accordance with the present invention. The n-type region 2 in this embodiment consists of a central strip 23 and an array of digits or projections 24 extending from both sides of the strip.

Figure 6:
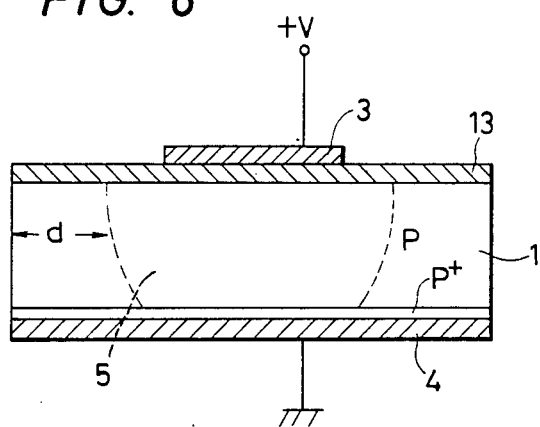
FIG. 6 is a cross section showing still another embodiment of the present invention.

It should be understood that the concept of the present invention is also applicable to a semiconductor of surface barrier type, as well as to a semiconductor of heterojunction structure having an amorphous semiconductor film formed on a single-crystal semiconductor substrate. FIG. 6 shows a radiation detector using a semiconductor of the heterojunction structure. A p-type silicon substrate 1 has a non-doped amorphous silicon layer 13 formed on the obverse surface and a p+ type layer on the reverse surface. A metal electrode 3 having the shape of the n-type region 2 shown in FIGS. 1 or 2 is formed on the amorphous silicon layer 13 by, for example, a vapor deposition or a lithographic patterning process. A metal electrode 4 is formed on the entire surface of the p+ layer on the back side. When a voltage V is applied between the two metal electrodes so that the electrode 3 is positive with respect to the other electrode, a depletion layer 5 is formed which assumes the shape of either the depletion layer shown in FIG. 1 or that shown in FIG. 2, depending upon the shape of the electrode 3. The minimum distance d between the periphery of the depletion layer 5 and the edge of the substrate 1 is approximately equal to the average mobility of the secondary electrons created by interactions with those gamma-rays having the highest energy of the incident gamma-rays to be detected. In this manner, almost all of the secondary electrons produced by interactions with the gamma-rays, even those of the highest energy that fall upon the area of substrate surrounding the depletion layer 5, contribute effectively to the production of electron-hole pairs within the depletion layer.

The mechanism behind the operation of the detector in accordance with the present invention is described below. Reference should first be made to FIGS. 4A and 4B. Upon interactions with incident gamma-rays 6, secondary electrons 7 are created within the depletion layer 5. Secondary electrons 71 are also generated in the region 12 around the depletion layer, and they move along the width of the substrate to reach the region of the depletion layer 5. Such secondary electrons 71 as well as the usual secondary electrons 7 contribute to the production of electron-hole pairs. In other words, not only the depletion layer 5 but also the surrounding region 12, indicated as the hatched area in FIG. 4A, contributes to the gamma-ray count. If the incident gamma-rays 6 have low energy levels, the region 12 is small since the resulting secondary electons have only a short average mobility. On the other hand, if the incident gamma-rays have high energy levels, this region is expanded because of the long average mobility of the secondary electrons.

S′ represents the area of the region 12 wherein secondary electrons contributing to the formation of electron-hole pairs are created, and S represents the area of the depletion layer 5. If S>>S′, the total area of the substrate that contributes to the production of secondary electrons remains substantially constant irrespective of the variation in the energy of incident gamma-rays, and the gamma count C depends only on the energy of gamma-rays E as indicated by formula (1). For the complementary case (S≦S′), the number of secondary electrons that contribute to the production of electron-hole pairs varies with the average mobility of such secondary electrons. Table 1 shows the relationship between the energy of gamma-rays (E) and each of three parameters, the average mobility of secondary electrons (ls), the absorption coefficient of air ($\mu$air), and the absorption coefficient of $S_i$ ($\mu$si).

TABLE 1

| Energy of gamma-rays (MeV) | Average range of secondary electrons ($\mu$m) | Absorption coefficient of air ($\times 10^{-4} cm^{-1}$) | Absorption coefficient of $S_i$ ($cm^{-1}$) |
|---|---|---|---|
| 0.10 | 20 | 0.279 | 0.440 |
| 0.20 | 30 | 0.324 | 0.300 |
| 0.35 | 42 | 0.356 | 0.240 |
| 0.66 | 170 | 0.356 | 0.180 |
| 1.25 | 500 | 0.336 | 0.140 |
| 2.00 | 1170 | 0.286 | 0.110 |
| 4.00 | 2800 | 0.233 | 0.078 |
| 6.00 | 4600 | 0.209 | 0.067 |

As will be seen from the Table, if the area S′ is adequately large, the number of secondary electrons that contribute to the formation of electron-hole pairs increases with E so as to cancel the term ($\mu$si/$\mu$air). E in formula (1). As a result, the energy dependency of the gamma count C is sufficiently decreased to provide a better "quality of radiation detection." This is the result if the area S' is sufficiently large such that all of the secondary electrons that are produced as a result of interactions with the incident gamma-rays migrate across that area to enter the depletion layer. Therefore, the minimum distance between the peripheral edge of the semiconductor substrate 1 and that of the depletion layer should be substantially equal to the average range of secondary electrons that are produced by the gamma-rays having the highest energy of the gamma-rays to be detected. As a guide, in order to ensure a good quality or radiation detection for gamma-rays having an energy between 0.1 and 6.0 MeV, the depletion layer should be surrounded by a region S' having a minimum width of 4,600 μm.

Another feature of the detector in accordance with the present invention is that the depletion layer 5 is so shaped as to have an elongated projection in the plane parallel to the substrate surface. This increases the probability that the secondary electrons 71 generated in the region 12 migrate through that region to arrive at the depletion layer 5.

As shown in the foregoing description, the depletion layer to be formed in the semiconductor radiation detector in accordance with the present invention is shaped so that it has a radial or digital array of projections and such a depletion layer is surrounded by a region which is capable of effective production of secondary electrons by interactions with gamma-rays having the highest energy of the gamma-rays to be detected. Because of this particular arrangement, the detector in accordance with the present invention is capable of counting high-energy gamma-rays irrespective of the energy of individual gamma-rays, thereby exhibiting a good quality of radiation detection. Consequently, the detector of the present invention can be used as a reliable gamma-ray dosimeter over a broader spectrum of energy than has not been possible with the conventional type.

The present invention has been disclosed in terms of preferred embodiments. The invention, however, is not limited thereto. The scope of the invention is determined by the appended claims and their equivalents.

What is claimed is:

1. A semiconductor device for detecting incident gamma radiation, said device comprising:
   a semiconductor substrate;
   voltage means for applying a voltage to separate surfaces of said substrate to produce a depletion layer in said substrate having a shape such that it includes a plurality of elongated projections within a plane parallel to a surface of said substrate receiving said incident radiation, the minimum distance between the side edges of said substrate and the outer extent of said depletion layer being substantially equal to the average range of mobility of secondary electrons created by the incident gamma-rays having the highest energy of the incident gamma rays to be detected; and
   means for counting current pulses due to electron-hole pairs generated in said depletion layer by secondary electrons created by interactions between gamma-rays incident on said substrate.

2. The device of claim 1, further comprising electrodes on said separate surfaces of said substrate to which said voltage means applies said voltage.

3. The device of claim 1 wherein said substrate consists essentially of silicon including a p-n junction, and said depletion layer is formed adjacent said p-n junction in said silicon substrate.

4. The device of claim 1 wherein said elongated projections emanate radially from a central portion of said substrate.

5. The device of claim 1 wherein said elongated projections are substantially parallel to one another and emanate from an elongated linear central position.

6. The device of claim 1 wherein said semiconductor substrate comprises a layer of amorphous semiconductor film formed on a single crystal portion of said substrate.

* * * * *